United States Patent [19]

Matsukura et al.

[11] Patent Number: 4,501,019
[45] Date of Patent: Feb. 19, 1985

[54] FREQUENCY MODULATION TRANSMITTER

[75] Inventors: Masayuki Matsukura; Yukio Fukumura, both of Tokyo, Japan

[73] Assignee: Nippon Electric Co., Ltd., Tokyo, Japan

[21] Appl. No.: 450,787

[22] Filed: Dec. 17, 1982

[30] Foreign Application Priority Data

Dec. 17, 1981 [JP] Japan .................. 56-204979

[51] Int. Cl.³ .............................................. H04B 1/04
[52] U.S. Cl. .................................. 455/112; 455/113; 455/76; 332/18
[58] Field of Search ............... 455/76, 110, 112, 113, 455/125, 119; 332/18, 19

[56] References Cited

U.S. PATENT DOCUMENTS 4,189,689  2/1980  Triplett .................. 332/18
4,313,209  1/1982  Drucker ................ 455/112
4,321,706  3/1982  Craft ..................... 455/113
4,422,053 12/1983  Brewerton ............ 455/112

FOREIGN PATENT DOCUMENTS

WO81/03250 11/1981 PCT Int'l Appl. ............. 455/112

Primary Examiner—Jin F. Ng
Attorney, Agent, or Firm—Blakely, Sokoloff, Taylor & Zafman

[57] ABSTRACT

A frequency modulation transmitter has a frequency synthesizer comprised of a voltage controlled oscillator for operating a transmitter section of the modulation transmitter. The output center frequency of the voltage controlled oscillator is determined by channel designation information. The level of a modulation input signal applied to the voltage controlled oscillator for modulating the center frequency is changed in accordance with the channel designation information.

1 Claim, 5 Drawing Figures

FREQUENCY MODULATION TRANSMITTER

BACKGROUND OF THE INVENTION

This invention generally relates to a transmitter/receiver and more particularly to an improvement in a frequency modulation (hereinafter referred to as FM) radio transmitter having a digital frequency synthesizer.

A voltage controlled oscillator (hereinafter referred to as VCO) serving as an oscillator of the frequency synthesizer in this type of FM transmitter has a non-linear output oscillation frequency characteristic with respect to the VCO control voltage applied to the control terminal of the VCO, owing to a non-linear characteristics of a voltage-dependent variable capacitor and other non-linear factors, though the output oscillation frequency characteristic should ideally be linear.

With the frequency synthesizer using a VCO having the above oscillation frequency characteristic as the oscillator, when FM modulation is effected by applying a modulation input signal in addition to the VCO control voltage, the modulation sensitivity level varies with the oscillation frequency of the VCO, though the modulation sensitivity level should ideally remain unchanged relative to the VCO oscillation frequency. In other words, when the center frequency of the VCO oscillation frequencies is changed to switch the transmission carrier wave frequency, the modulation sensitivity level is varied corresponding to the center frequency. If the relation between the modulation sensitivity level and VCO oscillation frequency is such that the modulation sensitivity level decreases as the VCO oscillation frequency increases, modulation will be deeper for low transmission carrier frequencies and shallower for high carrier frequencies even when the level of the low frequency signal applied as the modulation signal to the modulation signal input terminal of the VCO is fixed.

SUMMARY OF THE INVENTION

An object of the invention is to provide an improved FM radio transmitter incorporating a digital frequency synthesizer capable of making FM modulation sensitivity uniform.

According to the invention, there is provided a frequency modulation transmitter comprising: a transmitter section; a frequency synthesizer for operating the transmitter section including a loop connection of a voltage controlled oscillator, a frequency divider for frequency dividing the output signal of the voltage controlled oscillator and a comparator for comparing the output signal of the frequency divider with a reference frequency signal, and a channel controller for generating channel designation information for setting the frequency division ratio of the frequency divider; and means for applying a modulation input signal to the voltage controlled oscillator, characterized by means for setting the level of the modulation input signal according to the frequency division ratio of the frequency divider.

DESCRIPTION OF THE PREFERRED EMBODIMENTS

Figure 1:
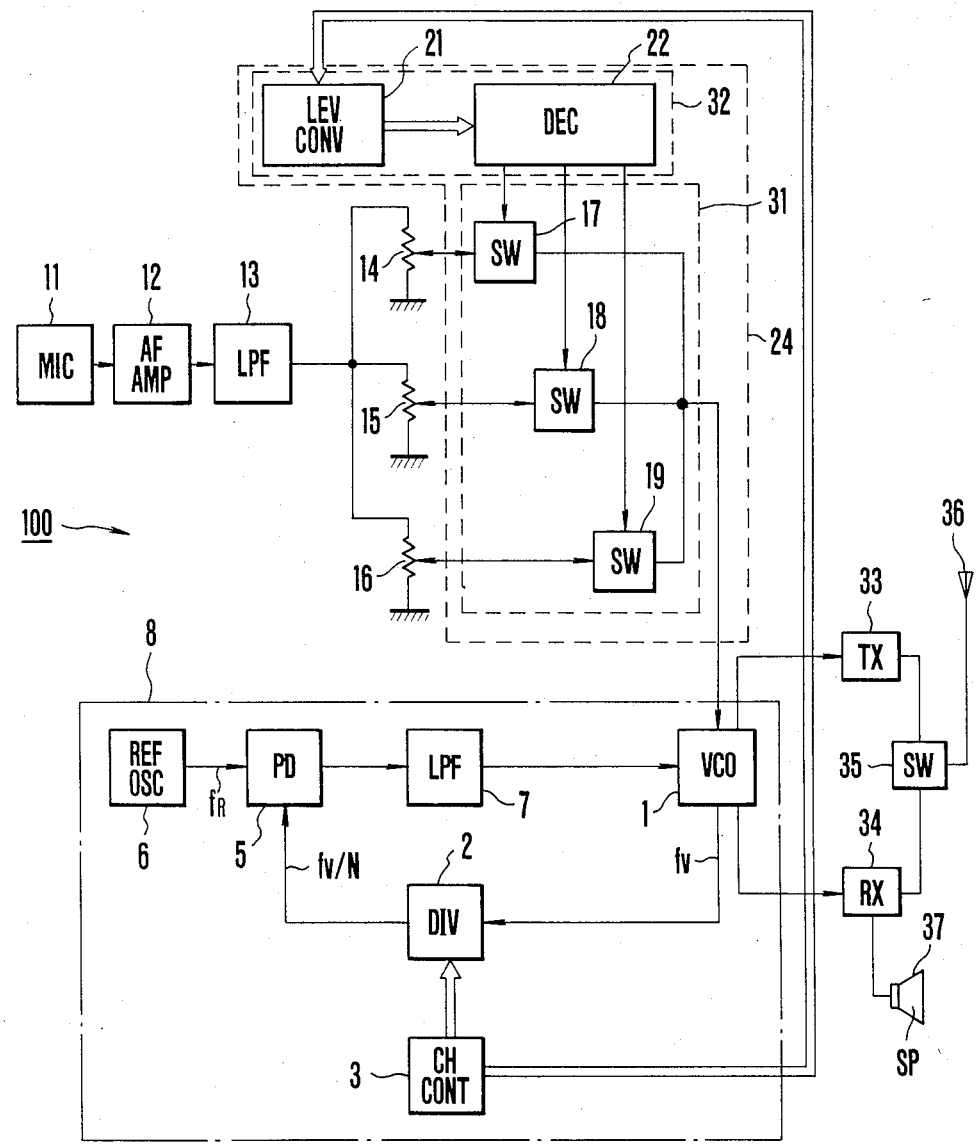
FIG. 1 is a block diagram showing a schematic, overall construction of a transmitter/receiver incorporating a frequency modulation transmitter embodying the invention.

Referring now to FIG. 1, there is illustrated, in block form, a transmitter/receiver 100 incorporating a frequency modulation transmitter according to the invention. In the figure, a VCO 1 generates an output signal fv led to a frequency divider 2. A first output signal of a channel controller 3 is led to a control terminal of the frequency divider 2, whose output signal, fv/N (N: integer), of which is led to one input terminal of a phase detector 5. A reference signal generator 6 generates a reference signal fR led to the other input terminal of the phase detector 5. The output signal of the phase detector 5 is coupled through a low-pass filter 7 to a control terminal of the VCO 1. A frequency synthesizer 8 is constituted by the above-mentioned components. A microphone 11 produces an audio signal fed to an audio frequency amplifier 12, the output signal of which is in turn fed to a low-pass filter 13. The output signal of the low-pass filter 13 is coupled through a potentiometer section comprised of variable resistors 14 to 16 connected in parallel and an analog switch section 31 comprised of analog switches 17 to 19 to a modulation signal input terminal of the VCO 1. The variable resistors 14 to 16 constitute respective potentiometers grounded at one end and the signal level passing through the potentiometer is variable. Thus, the potentiometer section changes the level of the modulation input signal to provide three different levels. The analog switches 17 to 19 are controlled by a second output signal of the channel controller 3 through a decoder 32 comprised of a level converter 21 and a decoder 22. The output signal of the VCO 1 is applied to operate a transmitter section 33 and a receiver section 34. When a switch 35 is transferred to the transmitter section 33, a radio frequency signal generated by the transmitter section 33 is transmitted from an antenna 36. With the switch 35 transferred to the receiver section 34, a radio frequency signal caught by the antenna 36 is processed by the receiver section 34 to drive a loudspeaker 37.

With the above-mentioned construction, the frequency divider 2 divides a signal fv generated from the VCO 1 to provide a frequency fv/N. The frequency division ratio 1/N is set by a channel designation signal from the channel controller 3. A phase detector provides an error signal which is proportional to the phase difference between the frequency division signal fv/N and a reference signal fR from the reference signal generator 6. The error signal is supplied to a control terminal of the VCO 1 through the LPF 7. The output frequency of the VCO 1 is determined according to the channel designation signal.

Meanwhile, an audio signal from the microphone 11 is amplified by the audio frequency amplifier 12, and only a necessary audible frequency band signal is passed through the low-pass filter 13 and converted to signals of predetermined levels through the potentiometers comprised of the variable resistors 14 to 16. The analog switches 17 to 19, to which the output signals of the respective potentiometers are supplied, are controlled according to the second output responsive to the channel designation data from the channel controller 3. More particularly, the channel controller 3 also generates, in response to the channel designation data standing for the first output signal, second output signals in the form of code signals representative of a plurality of sub-frequency bands within a transmission frequency band in use. The code signals are decoded into corresponding analog signals by the decoder 32. Each of the analog signals actuates each of the analog switches 17 to 19 for transmission of one of the different levels of the modulation input signal. Thus, the transmission frequency band is divided into a plurality of, three, for example, divisions, and the output signal of one of the variable resistors 14 to 16 corresponding to the channel designation data is supplied as a modulation signal to the modulation signal input terminal of the VCO 1.

Figure 2:
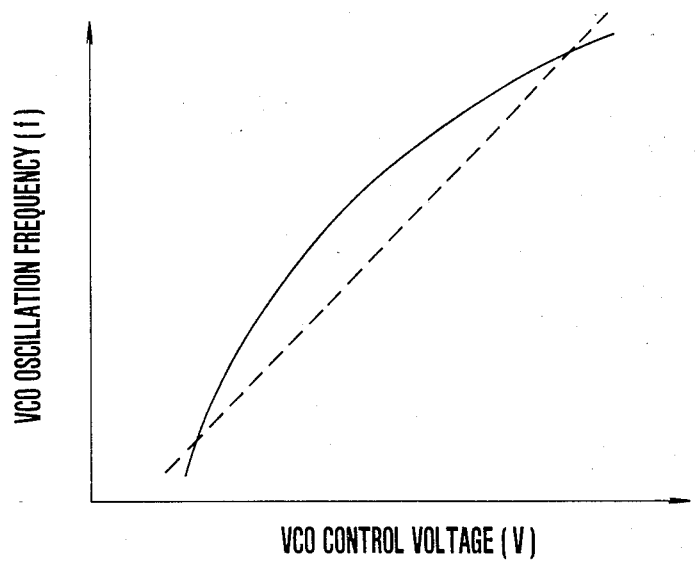
FIG. 2 is a graph showing an oscillation frequency characteristic of a VCO according to a prior art.
Figure 3:
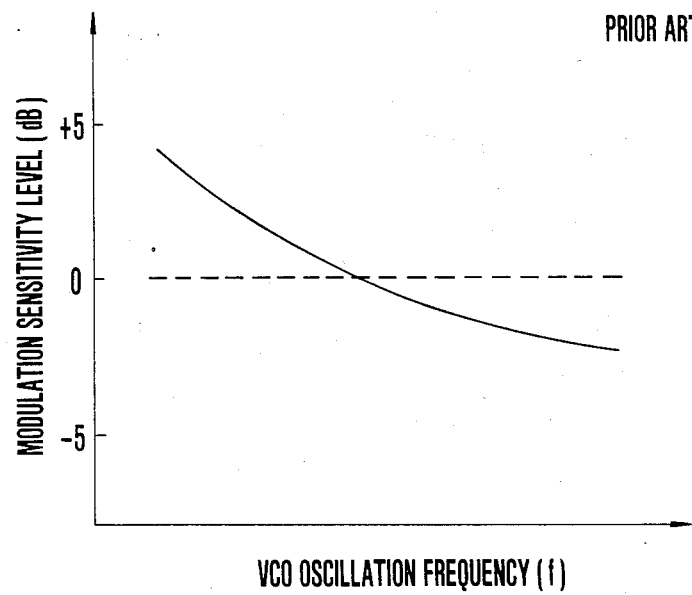
FIG. 3 is a graph showing a modulation sensitivity characteristic of the VCO according to the prior art.
Figure 4:
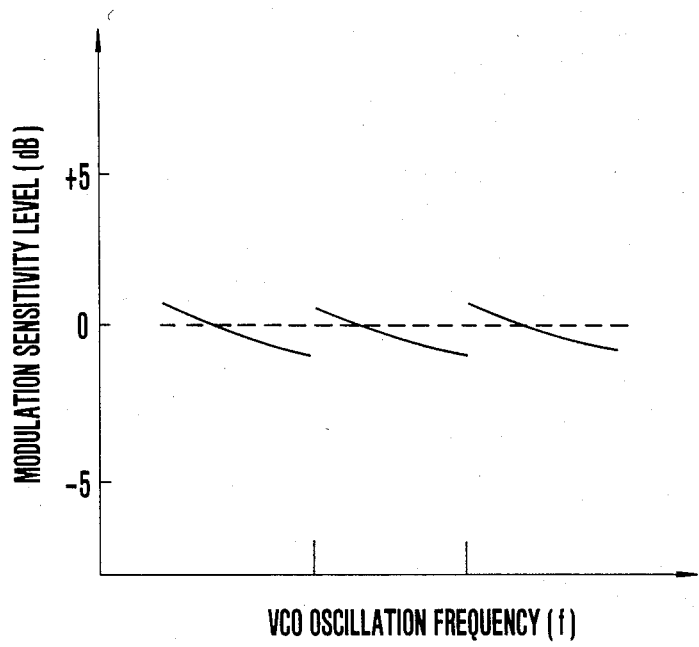
FIG. 4 is a graph showing the modulation sensitivity characteristic of the VCO obtained with the frequency modulation transmitter of FIG. 1.

With the modulation sensitivity corrected by dividing the oscillation frequency band of the VCO 1 into three divisions and effecting the modulaton with the modulation signal level corresponding to each of the divisions, a substantially uniform modulation sensitivity can be obtained even in the case of a wide band as shown in FIG. 4. In FIG. 4, the solid plot represents the modulation sensitivity characteristic in the individual sub-frequency bands or oscillation frequency regions, and the dashed plot represents the ideal characteristic. It will be appreciated that the relation between the VCO oscillation frequency and modulation sensitivity level as shown at a solid curve in FIG. 3 obtained with a conventional frequency modulation transmitter based on the VCO control voltage versus VCO oscillation frequency characteristic as shown at a solid curve in FIG. 2 can be improved to a great extent according to the foregoing embodiment. In FIGS. 2 and 3, a dotted line represents ideal characteristic.

While in the above-mentioned embodiment the modulation input terminal of the frequency synthesizer is provided on the VCO 1, it may be provided at any point in the loop. Further, for miniaturization, a one-chip IC analog multiplexer 24, for example μPD 4051BC, 4052BC or 4053BC manufactured by Nippon Electric Co., Ltd., which includes the level converter 21, decoder 22 and analog switches 17 to 19, may be used. Further, while in the above embodiment the oscillation frequency band of the VCO is divided into three divisions, this is by no means limitative. In general, variable resistors and analog switches are necessary in number corresponding to the number of divisions.

Figure 5:
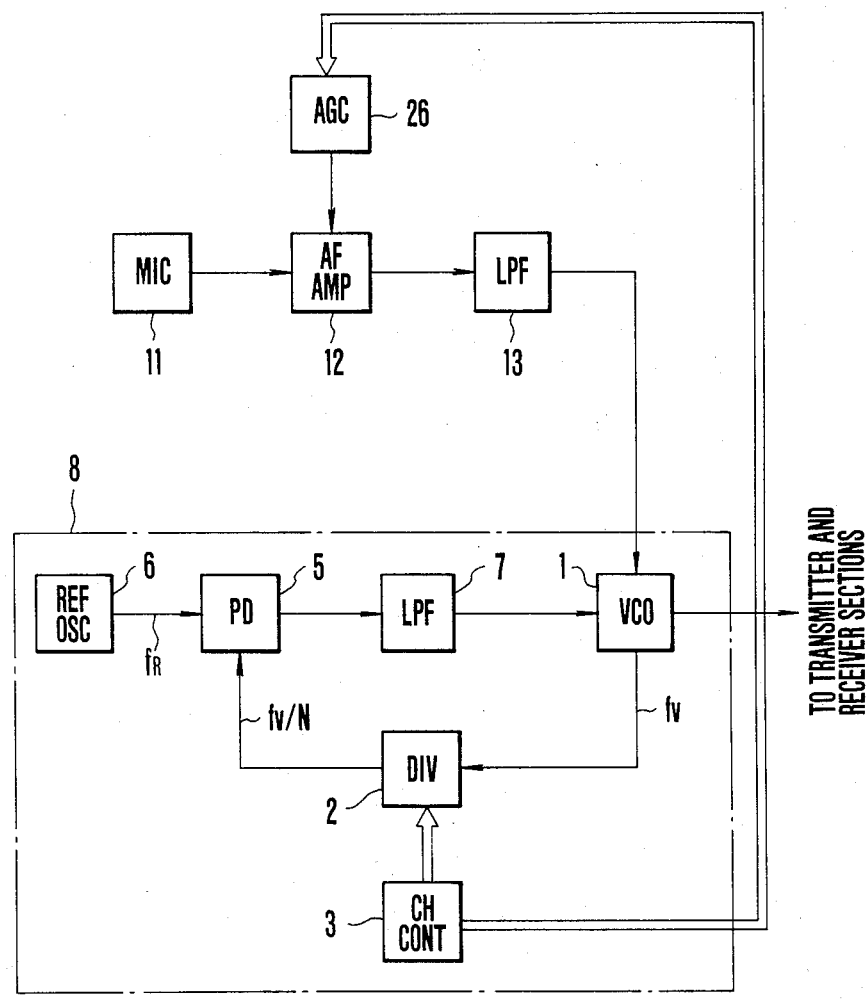
FIG. 5 is a fragmentary block diagram showing another embodiment of the frequency modulation transmitter according to the invention.

FIG. 5 is a block diagram showing an essential part of a second embodiment of the invention. This embodiment is different from the first embodiment of FIG. 1 in that the second output signals in response to the channel designation data from the channel controller 3 is led to a control terminal of an automatic gain control circuit 26 and the output thereof is led to the control terminal of the low frequency amplifier 12. The second output signals from the channel controller 3 may also be representative of sub-frequency bands within the transmission frequency band.

Thus, the output of the microphone 11 is coupled through the audio frequency amplifier 12 to the low-pass filter 13. This output is supplied to the modulation input terminal of the VCO 1. The second output signals of the channel controller 3 are led to the control terminal of the automatic gain control circuit 26.

For the rest, the embodiment of FIG. 5 is the same as the first embodiment of FIG. 1, and like parts designate like parts.

In the second embodiment of the above construction, the oscillation frequency of the VCO 1 is controlled with the frequency division ratio 1/N controlled according to the channel designation data from the channel controller 3. At the same time, the gain of the audio frequency amplifier 12 is controlled by the automatic gain control circuit 26 according to the second output signals in response to the channel designation data. Thus, the audio signal level from the microphone 11 is controlled according to the channel designation data, and the result is supplied to the modulation input terminal of the VCO 1. Thus, like the first embodiment, variations of the modulation sensitivity with the oscillation frequency of the VCO can be compensated for.

Again the modulation input terminal may not be provided on VCO 1 but may be provided at any point in the loop.

As has been described in the foregoing, according to the invention the channel designation data is used to control the oscillation frequency of the VCO and also control the modulation signal level for providing the modulation input Thus, a deviation of the modulation sensitivity of the VCO can be compensated for even in case of a wide band. Further, the FM modulation can be obtained directly without use of any compensating circuit such as an oscillator or a mixer, so that it is possible to simplify the circuit construction.

What is claimed is:

1. In a frequency modulation transmitter comprising: a transmitter section; a frequency synthesizer for operating the transmitter section including a loop connection of a voltage controlled oscillator, a frequency divider for frequency dividing the output signal of the voltage controlled oscillator and a comparator for comparing the output signal of the frequency divider with a reference frequency signal, and a channel controller for generating channel designation information for setting the frequency division ratio of the frequency divider; means for applying a modulation input signal to the voltage controlled oscillator; and switch means for setting the level of the modulation input signal according to the frequency division ratio of the frequency divider as set by the channel controller, said level setting means comprises: means, responsive to the channel designation information of said channel controller, for generating code signals representative of a plurality of sub-frequency bands within a transmission frequency band in use; means for decoding the code signals to generate corresponding analog signals; a plurality of means, connected to said modulation input signal applying means, for changing the level of the modulation input signal; and a plurality of switches, each connected between each level changing means and said voltage controlled oscillator, each being actuated in response to each of the analog signals.

* * * * *